United States Patent
Kihara et al.

(10) Patent No.: US 7,326,650 B2
(45) Date of Patent: Feb. 5, 2008

(54) METHOD OF ETCHING DUAL DAMASCENE STRUCTURE

(75) Inventors: Yoshihide Kihara, Hsin-chu (TW);
Shin Okamoto, Hsin-chu (TW);
Koichiro Inazawa, Yamanashi (JP);
Tomoki Suemasa, Santa Clara, CA (US)

(73) Assignee: Tokyo Electron Limited (JP)

( * ) Notice: Subject to any disclaimer, the term of this patent is extended or adjusted under 35 U.S.C. 154(b) by 304 days.

(21) Appl. No.: 10/399,626

(22) PCT Filed: Oct. 1, 2001

(86) PCT No.: PCT/JP01/08623

§ 371 (c)(1),
(2), (4) Date: Aug. 18, 2003

(87) PCT Pub. No.: WO02/33747

PCT Pub. Date: Apr. 25, 2002

(65) Prior Publication Data

US 2004/0026364 A1    Feb. 12, 2004

(51) Int. Cl.
*H01L 21/302* (2006.01)
(52) U.S. Cl. .................. 438/700; 438/706; 438/710; 438/720; 438/736; 438/738; 438/754; 216/47
(58) Field of Classification Search ........ 438/700, 438/706, 710, 720, 736, 738, 754, 551; 216/47
See application file for complete search history.

(56) References Cited

U.S. PATENT DOCUMENTS

| | | | |
|---|---|---|---|
| 5,821,169 A | 10/1998 | Nguyen et al. | |
| 6,060,380 A | 5/2000 | Subramanian et al. | |
| 6,312,874 B1* | 11/2001 | Chan et al. | 430/314 |
| 6,331,479 B1* | 12/2001 | Li et al. | 438/618 |
| 6,380,073 B1* | 4/2002 | Hwang et al. | 438/637 |
| 6,531,407 B1* | 3/2003 | Huang et al. | 438/758 |
| 2001/0002331 A1 | 5/2001 | Miyata | |

FOREIGN PATENT DOCUMENTS

| | | |
|---|---|---|
| EP | 0 905 768 A1 | 3/1999 |
| JP | 10-65003 | 3/1998 |
| JP | 10-294367 | 11/1998 |
| JP | 2000-150519 | 5/2000 |
| JP | 2001-077196 | 3/2001 |

OTHER PUBLICATIONS

International Preliminary Examination Report in International Application No. PCT/JP01/08623 with PCT Notification of Transmittal, mailed Aug. 4, 2003.
Supplementary European Search Report, Application No. 01970312.3-2203 PCT/JP0108623, mailed Dec. 29, 2005.

* cited by examiner

*Primary Examiner*—Binh X. Tran
(74) *Attorney, Agent, or Firm*—Finnegan, Henderson, Farabow, Garrett & Dunner, L.L.P.

(57) ABSTRACT

In an etching method for achieving a dual damascene structure by using at least one layer of a low-k film and at least one layer of a hard mask, a dummy film, which is ultimately not left in the dual damascene structure, is formed in at least one layer over the hard mask in order to prevent shoulder sag. By adopting this method, a dual damascene structure in which the extent of the shoulder sag at the hard mask is minimized can be achieved through etching.

25 Claims, 8 Drawing Sheets

FIG.6

| MIXED GAS / FILM | CH$_2$F$_2$, O$_2$, Ar | CF$_4$, O$_2$, Ar | N$_2$, H$_2$ | C$_4$F$_8$, CO, Ar |
|---|---|---|---|---|
| SiON | ○ | ○ | × | × |
| SiO$_2$ | △ | ○ | × | ○ |
| ORGANIC LOW K | ○ | ○ | ○ | △ |
| FSG | △ | ○ | × | ○ |
| SiN | ○ | ○ | × | × |

METHOD OF ETCHING DUAL DAMASCENE STRUCTURE

BACKGROUND OF THE INVENTION

The present invention relates to an etching method that may be adopted to achieve a dual damascene structure.

As higher integration in semiconductor integrated circuits is pursued with increasing vigor, rapid progress has been made in the field of the technology for manufacturing multilayered semiconductor devices in recent years. It is necessary to form both trench wiring to connect elements arranged along the horizontal direction and via hole wiring to connect elements arranged along the vertical direction when manufacturing a semiconductor device with a multi-layer structure. In recent years, copper, due to its low resistance and outstanding antielectro-migration characteristics, is typically used as the wiring material. An organic low-k (Low-dielectric-constant) material such as SiLK™ (product of Dow Chemical, U.S.), which assures a low dielectric constant, is used as a layer insulating film material with a low dielectric constant of 4 or lower relative to the dielectric constant of quartz. Alternatively, an inorganic low-k material, such as fluorine-added silicon oxide (hereafter referred to as an FSG film) with a low dielectric constant, is used for the layer insulating material.

It is to be noted that a wiring pattern is formed with copper, with which a compound with a high vapor pressure cannot easily be formed, by adopting a so-called damascene structure with an embedded wiring achieved through metal CMP technology. In addition, semiconductor elements with a so-called dual damascene structure achieved by simultaneously forming trench wiring for connecting the individual elements arranged along the horizontal direction and via wiring for connecting the elements arranged along the vertical direction have become increasingly common recently. When creating such a dual damascene structure, the insulating layer is etched by using a hard mask formed through patterning to form the trenches and the vias.

FIGS. 7 and 8 present an example of a process through which a dual damascene structure is formed in the related art. As shown and FIG. 7A, an FSG layer 4 constituted of an inorganic low-k film is formed as a layer insulating film on top of an SiN layer 2 provided as a protective film. Over the FSG layer 4, a SiLK™ layer 6 constituted of an organic low-k film is formed and over the SiLK™ layer 6, an SiO$_2$ layer 8 constituting a first hard mask and a silicon oxide nitride film (hereafter referred to as an SiON film) layer 10 constituting a second hard mask are formed as hard mask layers to be used to form trenches and vias. Over the hard mask layers, a photoresist (PR) layer 12 having a pattern to be used for trench formation is formed.

First, as shown in FIG. 7B, the SiON layer 10 constituting the second hard mask is etched through a specific lithography process by using the photoresist (PR) layer 12 for trench formation and thus, a trench pattern is formed. Then, as shown in FIG. 7C, a photoresist (PR) layer 14 for via formation is formed.

Next, as shown in the FIG. 7D, the SiO$_2$ layer 8 constituting the first hard mask is etched through a specific lithography process by using the photoresist (PR) layer 14 for via formation and thus, a via pattern is formed.

Then, using the hard mask for via formation formed in the preceding step, the SiLK™ layer 6 constituted of an organic low-k film is etched to form a via and the photoresist (PR) layer 14 is removed through ashing as shown in FIG. 7E.

Next, as shown in FIG. 7F, a trench pattern is formed at an SiO$_2$ layer 8 constituting the first hard mask by using the trench pattern at the SiON layer 10 formed as the second hard mask and also, vias are formed at the FSG layer 4 by using the via formed at the SiLK™ layer 6 a via pattern.

Next, as shown in FIG. 8A, the trench pattern at the SiO$_2$ layer 8 constituting the first hard mask and the SiON layer 10 constituting the second hard mask is used to form a trench pattern at the SiLK™ layer 6.

Next, as shown in FIG. 8B, the SiN layer 2 is etched by using the via pattern at the FSG layer 4 to form through via holes. Thus, a dual damascene structure is completed by forming the trenches and the vias simultaneously. Then, the wiring process is completed by embedding Cu or a metal containing Cu (not shown) into the trenches and the vias.

However, during a step in which a hard mask becomes exposed in the process described above, shoulder sag, whereby the shoulders of the hard mask are ground and the shoulder edges become tapered, tends to occur readily. For instance, during the step shown in FIG. 7F, shoulder sag occurs as shown in FIG. 9 at the SiO$_2$ layer 8 constituting the first hard mask and the SiON layer 10 constituting the second hard mask which have become exposed due to over-etching after removing the photoresist (PR) layer 14.

The shoulder sag that occurs at the SiON layer 10 constituting the second hard mask, in particular, cannot be corrected through subsequent steps and rather, the shoulder tends to become further ground through etching in the subsequent steps. The shoulder sag occurring at the hard mask induces over-polishing (dishing) over densely patterned areas during a post-processing step such as a CMP step, which, in turn, may lead to shorting of the wiring.

An object of the present invention, which has been completed by addressing the problem discussed above, is to provide an etching method for achieving a dual damascene structure, through which the extent of shoulder sag at a hard mask can be minimized.

SUMMARY OF THE INVENTION

In order to achieve the object described above, a first aspect of the present invention provides an etching method for achieving a dual damascene structure by using at least one layer of a low-k film and at least one layer of a hard mask, characterized in that a dummy film constituted of a material matching that constituting the hard mask, which will not ultimately be left in the dual damascene structures, is formed in at least one layer over the hard mask in order to prevent shoulder sag. Through this method in which the dummy film instead of the hard mask becomes exposed during a step in which the hard mask would be exposed in the related art and thus, the dummy film is used as a protective film, the extent of shoulder sag at the hard mask can be minimized. Furthermore, by covering the hard mask with the dummy film constituted of the same material used to form the hard mask, the low-k film (e.g., a SiLK™ layer) which has become exposed can be covered again and, as a result, the material such as SiLK™ constituting the low-k film and the resist are not allowed to mix together. It is to be noted that, since this dummy film is ultimately removed, its presence does not affect the finished dual damascene structure.

In this method, it is desirable to form the low-k film with two different types of films which are etched by using different gases, and in such a case, the lower low-k film may be an inorganic low-k film and the upper low-k film may be an organic low-k film. The inorganic low-k film may be constituted of, for instance, FSG, whereas the organic low-k film may be constituted of, for instance, SiLK™.

In addition, the hard mask may be formed over a single layer or two layers. Preferably, such a hard mask should be constituted of SiON. Since an SiON film can be used as a reflection-reducing film as well, an added advantage of sustaining dimensional stability during the lithography process is achieved. The dummy film may include a film constituted of the material with which the hard mask is formed, or it may be constituted of SiON.

A second aspect of the present invention provides an etching method for achieving a dual damascene structure, through which vias are formed at an inorganic low-k film layer and trenches are formed at an organic low-k film layer by etching the inorganic low-k film, the organic low-k film, a first hard mask and a second hard mask sequentially laminated on a lower wiring layer, comprising a first step in which a trench pattern is formed at the second hard mask through a lithography process, a second step in which a third hard mask is formed over the trench pattern constituted of the second hard mask, a third step in which a via pattern is formed at the third hard mask and the first hard mask through a lithography process, a fourth step in which vias are formed at the organic low-k film by using the via pattern constituted of the third hard mask and the first hard mask, a fifth step in which the third hard mask is at least partially removed, a sixth step in which the remaining third hard mask layer is removed, a trench pattern is formed at the first hard mask by using the trench pattern constituted of the second hard mask and vias are formed at the inorganic low-k film by using the vias formed at the organic low-k film as a via pattern without altering etching conditions and a seventh step in which trenches are formed at the organic low-k film by using the trench pattern constituted of the first and second hard masks. In this method, even if shoulder sag occurs at the third hard mask during the step in which it becomes exposed, a hard mask with no shoulder sag can be reformed by removing part of the third hard mask. In addition, since the third hard mask functions as a protective film, shoulder sag at the second hard mask can be minimized.

In this case, it is desirable to form the third hard mask as a dummy film that is not ultimately allowed to remain in the dual damascene structure and includes a plurality of film layers. Then, the upper layer of the third hard mask can be removed through the fifth step and the lower layer of the third hard mask can be removed through the sixth step. It is to be noted that the upper layer of the third hard mask may be constituted of SiON, whereas the lower layer may be constituted of a silicon oxide film (hereafter referred to as "oxide"). The use of an SiON film which also functions as a reflection-reducing film achieves an added advantage of sustaining dimensional stability during the lithography process.

In addition, a third aspect of the present invention provides an etching method for achieving a dual damascene structure, through which vias are formed at an inorganic low-k film layer and trenches are formed at an organic low-k film layer by etching the inorganic low-k film, the organic low-k film, a first hard mask and a second hard mask sequentially laminated on a lower wiring layer, comprising a first step in which a trench pattern is formed at the second hard mask through a lithography process, a second step in which a third hard mask is formed over the trench pattern constituted of the second hard mask, a third step in which a via pattern is formed at the third hard mask and the first hard mask through a lithography process, a fourth step in which vias are formed at the organic low-k film by using the via pattern constituted of the third hard mask and the first hard mask, a fifth step in which the third hard mask layer is removed, a trench pattern is formed at the first hard mask by using the trench pattern constituted of the second hard mask and vias are formed at the inorganic low-k film by using the vias formed at the organic low-k film as a via pattern without altering etching conditions and a sixth step in which trenches are formed at the organic low-k film by using the trench pattern constituted of the first and second hard masks. In addition, since the third hard mask functions as a protective film, shoulder sag at the second hard mask can be prevented. In this method, the third mask may be formed as a dummy film which is ultimately not allowed to remain in the dual damascene structure and includes a plurality of film layers.

A fourth aspect of the present invention provides an etching method for achieving a dual damascene structure, through which vias are formed at an inorganic low-k film layer and trenches are formed at an organic low-k film layer by etching the inorganic low-k film, the organic low-k film and a first hard mask sequentially laminated on a lower wiring layer, comprising a first step in which a trench pattern is formed at part of the first hard mask through a lithography process, a second step in which a second hard mask is formed over the trench pattern at the first hard mask, a third step in which a via pattern is formed at the remaining first hard mask and the second hard mask through a lithography process, a fourth step in which vias are formed at the organic low-k film by using the via pattern constituted of the first and second hard masks, a fifth step in which a trench pattern is formed by removing the second hard mask and etching the trench pattern portion of the first hard mask, a sixth step in which vias are formed at the inorganic low-k film by using the vias formed at the organic low-k film as a via pattern and a seventh step in which trenches are formed the organic low-k film by using the trench pattern constituted of the first hard mask. By adopting this method, in which a hard mask with no shoulder sag can be reformed by removing the second hard mask even if shoulder sag occurs at the second hard mask during the step in which it becomes exposed, the second hard mask acts as a protective film to minimize the extent of shoulder sag at the first hard mask.

A fifth aspect of the present invention provides an etching method for achieving a dual damascene structure, through which vias are formed at an inorganic low-k film layer and trenches are formed at an organic low-k film layer by etching the inorganic low-k film, the organic low-k film and a first hard mask sequentially laminated on a lower wiring layer, comprising a first step in which a trench pattern is formed at part of the first hard mask through a lithography process, a second step in which a second hard mask is formed over the trench pattern at the first hard mask, a third step in which a via pattern is formed at the remaining first hard mask and the second hard mask through a lithography process, a fourth step in which vias are formed at the organic low-k film by using the via pattern constituted of the first and second hard masks, a fifth step in which vias are formed at the inorganic low-k film by using the vias formed at the organic low-k film as a via pattern, a sixth step in which the second hard mask is removed, a seventh step in which a trench pattern is formed by etching the trench pattern portion of the first hard mask and an eighth step in which trenches are formed at the organic low-k film by using the trench pattern constituted of the first hard mask.

It is desirable to form the first and second hard masks of a single material. In such a case, even if part of the first hard mask undergoing a process of partial etching becomes over-etched and the organic low-k film becomes exposed as a result, it is covered with the second hard mask constituted of the same material and thus, no mixing occurs. It is to be noted that the first and second hard mask should be preferably constituted of SiON. The use of SiON, which also acts as a reflection-reducing film, achieves an added advantage of sustaining dimensional stability during the lithography process.

BRIEF DESCRIPTION OF THE DRAWINGS

FIG. 6 presents a chart of the etching capabilities of different mixed gases for etching various films;

DETAILED DESCRIPTION OF THE PREFERRED EMBODIMENTS

Figure 1:
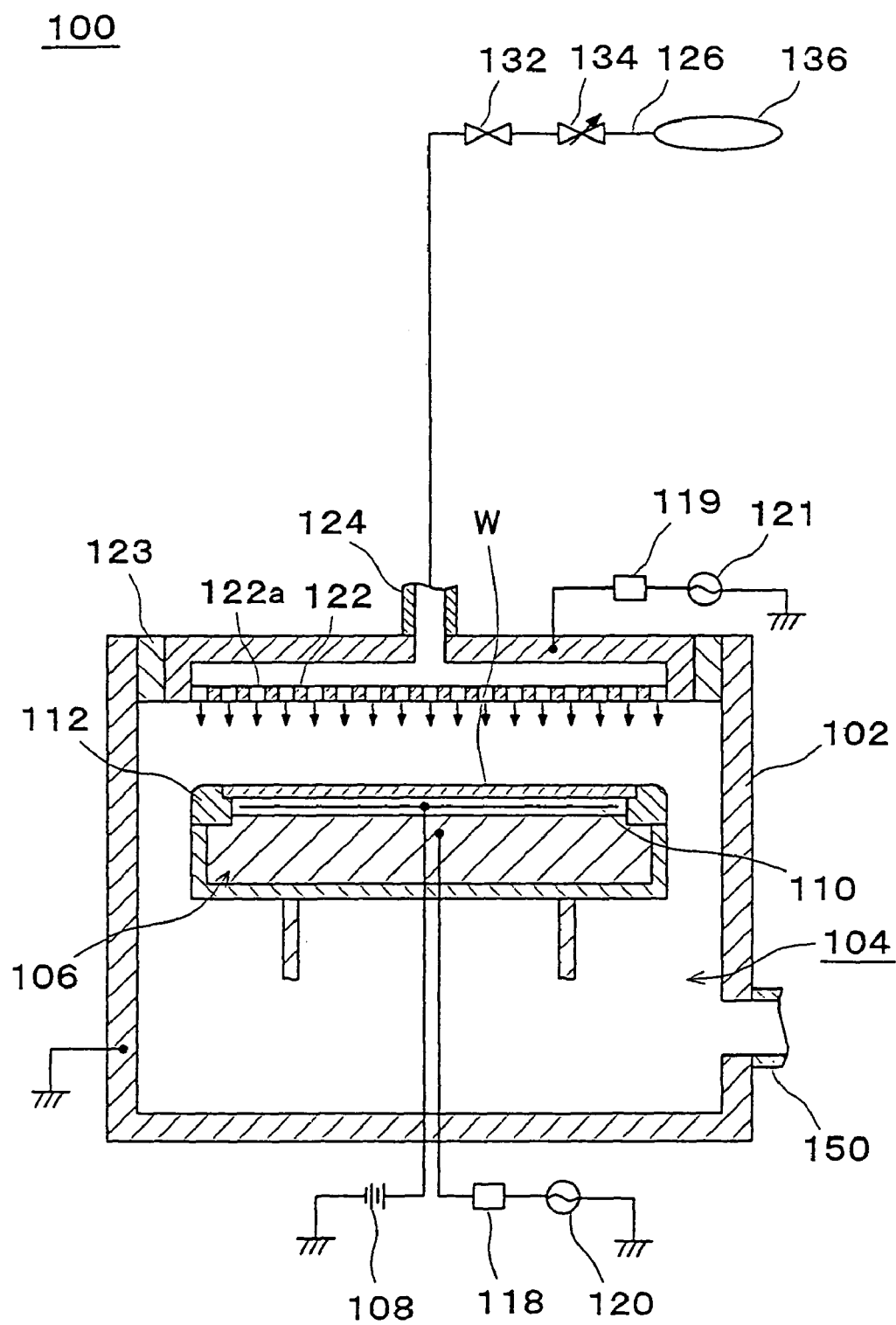
FIG. 1 schematically illustrates the structure of an etching apparatus in which the present invention may be adopted.

The following is an explanation of preferred embodiments of the etching method according to the present invention, given in reference to the attached drawings. It is to be noted that the same reference numerals are assigned to members achieving substantially identical functions and structural features in the following explanation and the attached drawings to preclude the necessity for a repeated explanation thereof.

First, the structure of a plane-parallel type plasma etching apparatus is briefly explained as an example of an etching apparatus in which the etching methods achieved in the embodiments may be adopted, in reference to FIG. 1.

A processing chamber 104 is formed inside a processing container 102 which is grounded for safety in an etching apparatus 100 in the figure, with a lower electrode 106 constituting a susceptor capable of moving up/down freely provided inside the processing chamber 104. At the top of the lower electrode 106, an electrostatic chuck 110 connected to a high-voltage DC source 108 is provided, and a substrate such as a semiconductor wafer (hereafter referred to as a "wafer") W is placed on the upper surface of the electrostatic chuck 110. An insulating focus ring 112 is set around the wafer W placed on the lower electrode 106. A high-frequency source 120 is connected to the lower electrode 106 via a matcher 118.

At the ceiling of the processing chamber 104 facing opposite the surface of the lower electrode 106 on which the substrate is placed, an upper electrode 122 having numerous gas outlet holes 122a is provided. The upper electrode 122 and the processing container 102 are electrically insulated from each other by an insulator 123 provided between them. A high-frequency source 121 which outputs plasma-generating high-frequency power is connected to the upper electrode 122 via a matcher 119. A gas supply pipe 124 is connected with the gas outlet holes 122a and a process gas supply system 126 is connected to the gas supply pipe 124. A gas supply source 136 from which the process gas is supplied via a switching valve 132 and a flow-regulating valve 134 is connected to the process gas supply system 126.

Near the bottom of the processing container 102, an evacuating pipe 150 communicating with an evacuating mechanism (not shown) is connected, and by engaging the evacuating mechanism in operation, the atmosphere inside the processing chamber 104 can be maintained at a predetermined low pressure level.

Figure 2A:
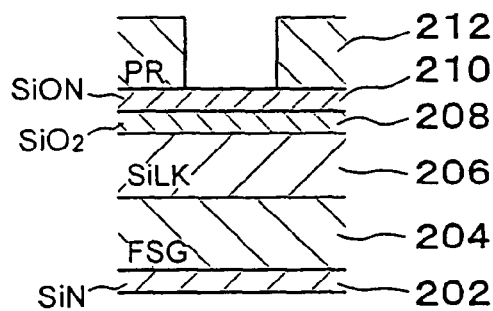
FIG. 2 shows steps executed in an etching method achieved in an embodiment.

Next, the steps executed to form a dual damascene structure in a first embodiment of the present invention by using the etching apparatus described above are explained in reference to FIGS. 2 and 3. As shown and FIG. 2A, an FSG layer 204 constituted of an inorganic low-k film (with a film thickness of 500 nm) is formed as a layer insulating film on top of an SiN layer 202 (with a film thickness of 50 nm), which functions as a protective film. Over the FSG layer 204, a SiLK™ layer 206 (with a film thickness of 400 nm) is formed as an organic low-k film. Over the SiLK™ layer 206, an $SiO_2$ layer 208 (with a film thickness of 100 nm) constituting a first hard mask and an SiON layer 210 (with a film thickness of 100 nm) constituting a second hard mask are formed as hard mask layers to be used to form trenches and vias and, over the hard mask layers, a photoresist (PR) layer 212 having a pattern to be used for the trench formation is formed.

Figure 2B:
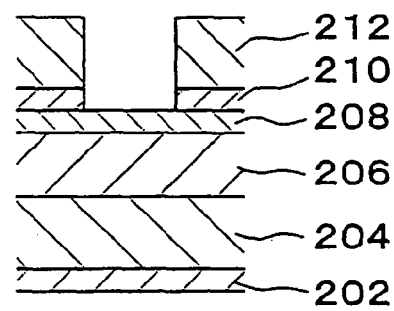

First, as shown in FIG. 2B, the SiON layer 210 constituting the second hard mask is etched and a trench pattern is formed through a specific lithography process executed by using the photoresist (PR) layer 212 for trench formation (first step). The etching conditions under which this step is executed include, for instance, the pressure of the atmosphere within the processing chamber set to 50 mT, the level of the power applied to the electrode set to 500 W and the flow rates of the individual gases $CH_2F_2$, $O_2$ and Ar constituting the mixed gas set to 20 sccm, 20 sccm and 100 sccm respectively.

Figure 2C:
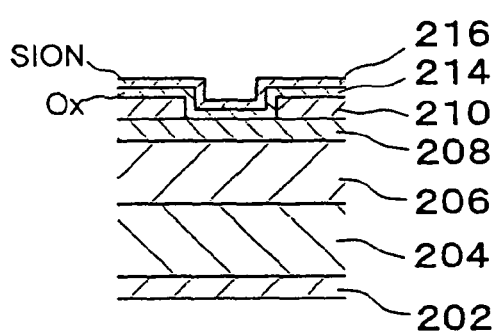
Figure 2D:
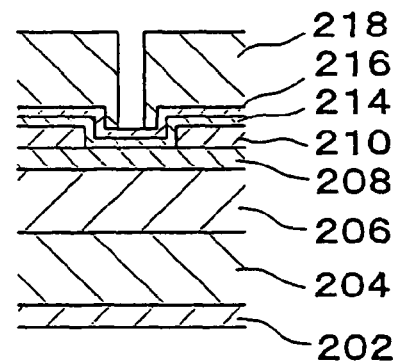

After the remaining photoresist (PR) layer 212 is removed through ashing, a third hard mask is formed over the trench pattern constituted of the second hard mask, as shown in FIG. 2C (second step). In this embodiment, the third hard mask is a thin film constituted of two layers, i.e., a lower oxide layer 214 (with a film thickness of less than 10 nm) and an upper SiON layer 216 (with a film thickness of less than 10 nm). While the oxide layer 214 and the SiON layer 216 may be formed through CVD (chemical vapor deposition), they may be formed through spin-coating as well. The oxide layer 214 and the SiON layer 216 can be formed through the spin-coating by applying inorganic SOG with an extremely low viscosity at approximately 5000 rpm and allowing of the inorganic SOG thus applied to harden at 400° C. Then, as shown in FIG. 2D a photoresist (PR) layer 218 for via formation is formed over the third hard mask.

Figure 2E:
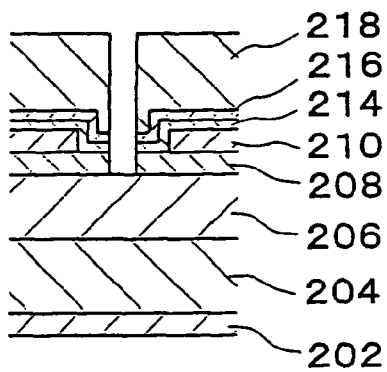

Next, as shown in FIG. 2E, the oxide layer 214 and the SiON layer 216 constituting the third hard mask and the $SiO_2$ layer 208 constituting the first hard mask are etched to form a via pattern through a specific lithographic process executed by using the photoresist (PR) layer 218 for via information (third step). This step is executed under etching conditions which include, for instance, the pressure of the atmosphere within the processing chamber set to 40 mT, the level of power applied to the electrodes set to 1500 W and the flow rates of $CF_4$, $O_2$ and Ar constituting the mixed gas set to 80 sccm, 20 sccm and 160 sccm respectively.

Figure 2F:
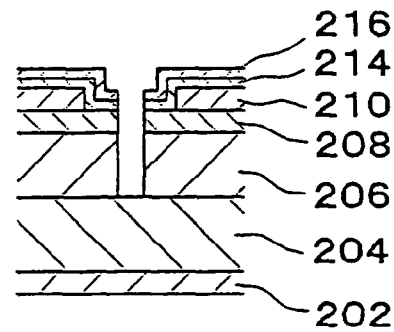

Then, by using the via hard mask constituted of the third hard mask and the first hard mask, which has been formed in the third step, the SiLK™ layer 206 constituted of an organic low-k film is etched and vias are formed at the SiLK™ layer 206 and the photoresist (PR) layer 218 is removed through ashing, as shown in FIG. 2F (fourth step). This step is executed under etching conditions which include, for instance, the pressure of the atmosphere within the processing chamber set to 100 mT, the level of the power applied to the electrodes set to 1000 W and the flow rates of $N_2$ and $H_2$ constituting the mixed gas set to 100 sccm and 300 sccm respectively. After the photoresist (PR) layer 218 is removed during the step, shoulder sag may occur at the exposed third hard mask due to over-etching.

Figure 3A:
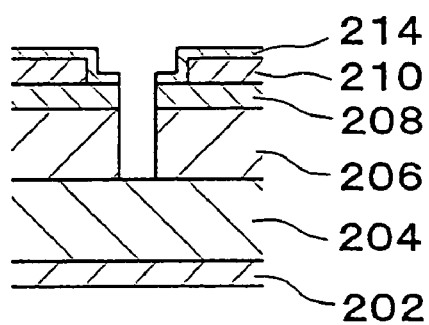
FIG. 3 shows steps executed in the etching method achieved in the embodiment.

Accordingly, the upper layer of the third hard mask, i.e., the SiON layer 216, where the shoulder sag has occurred is removed through isotropic etching, as shown in FIG. 3A (fifth step). This etching process should be executed at the lowest possible ion energy level and under conditions which achieves a high selection ratio relative to $SiO_2$, or the process should be executed through wet etching. Since the lower layer, i.e., the oxide layer 214, is still present after the upper SiON layer 216 is removed, a third hard mask with no shoulder sag is reformed.

Figure 3B:
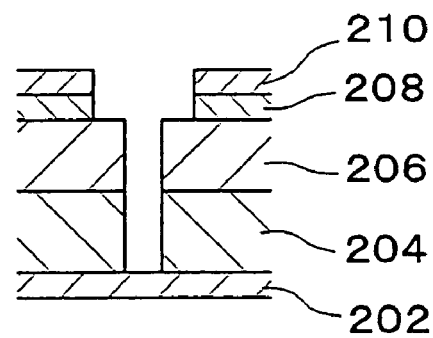

Next, as shown in FIG. 3B, the lower layer of the third hard mask, i.e., the oxide layer 214, is removed, a trench pattern is formed at the $SiO_2$ layer 208 constituting the first hard mask by using the trench pattern at the SiON layer 210 constituting the second hard mask and vias are formed at the FSG layer 204 by using the vias formed at the SiLK™ layer 206 as a via pattern under etching conditions which remain unchanged throughout the step (sixth step). The etching conditions include, for instance, the pressure of the atmosphere within the processing chamber set to 45 mT, the level of the power applied to the electrodes set to 1500 W and the flow rates of the $C_4F_8$, CO and Ar constituting the mixed gas set to 12 sccm, 225 sccm and 400 sccm respectively.

Figure 3C:
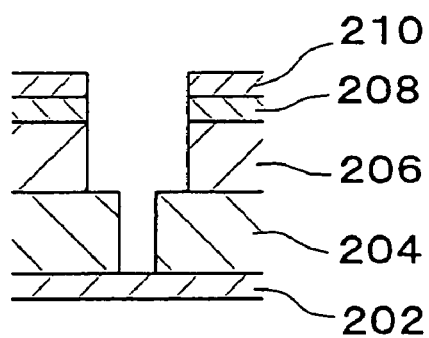

Then, as shown in FIG. 3C, a trench pattern is formed at the SiLK™ layer 206 by using the trench pattern at the $SiO_2$ layer 208 constituting the first hard mask and at the SiON layer 210 constituting the second hard mask (seventh step).

Figure 3D:
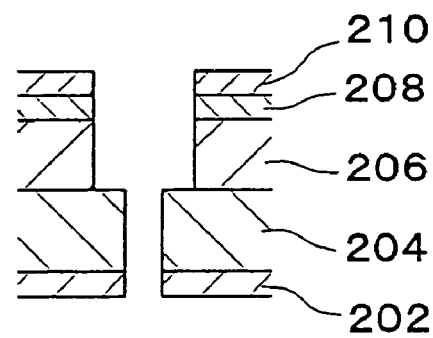

Next, as shown in FIG. 3D, the SiN layer 202 is etched by using the via pattern at the FSG layer 204 to achieve a through via hole. This process should be executed under etching conditions which include, for instance, the pressure of the atmosphere within the processing chamber set to 30 mT, the level of the power applied to the electrodes set to 500 W and the flow rates of $CH_2F_2$, $O_2$ and Ar constituting the mixed gas set to 20 sccm, 20 sccm and 100 sccm respectively. Through the steps described above a dual damascene structure having trenches and vias formed simultaneously therein is completed. Then, a wiring step is completed by embedding Cu or a metal containing Cu (not shown) in the trenches and the vias.

It is to be noted that FIG. 6 presents a chart of the relative etching capabilities of the various mixed gases used in the etching processes for processing the individual films. ○, Δ and X in the chart respectively indicate high etching capability, intermediate etching capability and low etching capability. While a mixed gas marked X does not have any chemical etching capability, it does have a degree of physical etching capability.

As described above, by forming the third hard mask over the second hard mask for trench pattern formation as a dummy film which is ultimately not left in the dual damascene structure, the first and second hard masks that become exposed in the etching methods in the related art are protected and thus, it becomes possible to prevent shoulder sag from occurring at these hard masks. In addition, the 2-layer structure adopted in the third hard mask allows a hard mask with no shoulder sag to be reformed by removing the upper layer of the third hard mask where shoulder sag has occurred during the process. These advantages will prove even more effective under circumstances in which the adverse effects of the shoulder sag is more significant in the related art, i.e., when the width of the trenches is approximately 0.18 μm or smaller and the via diameter is approximately 0.13 μm or smaller. In addition, since the SiON layer constituting the upper stratum of the third hard mask also functions as a reflection-reducing film, there is an added advantage of sustaining dimensional stability during the lithography process.

It is to be noted that all the remaining SiON layer 216 may be removed together with the lower oxide layer 214 in the sixth step with only part of the SiON layer 216 or none of the SiON layer 216 constituting the upper layer of the third hard mask removed through the fifth step, as a variation. If the sixth step is executed while at least part of the SiON layer 216 is still present, the first hard mask is not etched readily during the sixth step. As a result, an advantage of minimizing the extent of shoulder sag at the via holes formed at the SiLK™ layer 206 is achieved in this case, in addition to the advantages discussed above.

The following is an explanation of the steps executed to form a dual damascene structure in the second embodiment of the present invention by using the etching apparatus shown in FIG. 1, given in reference to FIGS. 4 and 5. As shown in FIG. 4A, an FSG layer 204 is formed as an inorganic low-k film (with a film thickness of 500 nm) constituted of a layer insulating film on top of an SiN layer 202 (with a film thickness of 50 nm) as a protective film. Over the FSG layer 204, a SiLK™ layer 206 (with a film thickness of 400 nm) is formed as an organic low-k film. Over the SiLK™ layer 206, an SiON layer 308 (with a film thickness of 200 nm) constituting a first hard mask is formed as a hard mask layer to be used to form trenches and vias and, over the hard mask layers, a photoresist (PR) layer 212 having a pattern to be used for trench formation is formed.

Figure 4A:
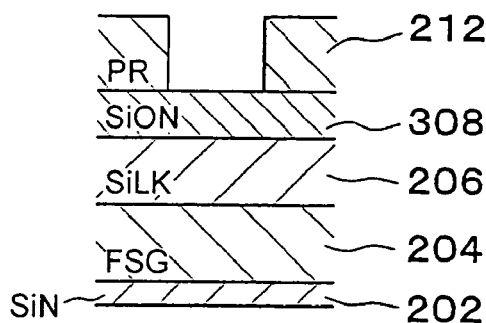
FIG. 4 shows steps executed in an etching method achieved in an embodiment.
Figure 4B:
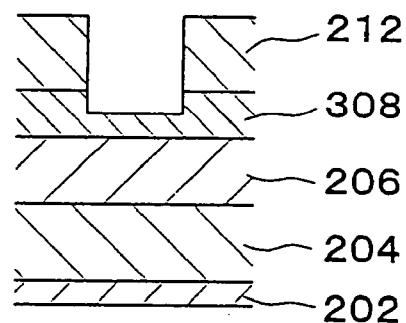

First, as shown in FIG. 4B, the SiON layer 308 constituting the first hard mask is partially etched and a trench pattern is formed through a specific lithography process executed by using the photoresist (PR) layer 212 for trench formation (first step). The etching conditions under which this step is executed include, for instance, the pressure of the atmosphere within the processing chamber set to 50 mT, the level of the power applied to the electrodes set to 500 W and the flow rates of the individual gases $CH_2F_2$, $N_2$ and Ar constituting the mixed gas set to 20 sccm, 100 sccm and 100 sccm respectively.

Figure 4C:
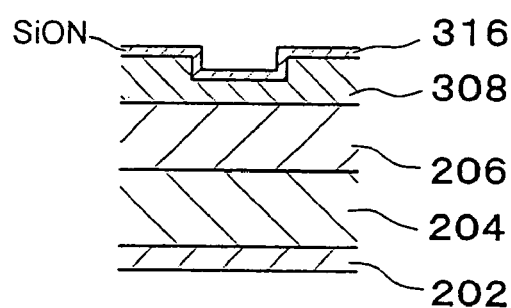
Figure 4D:
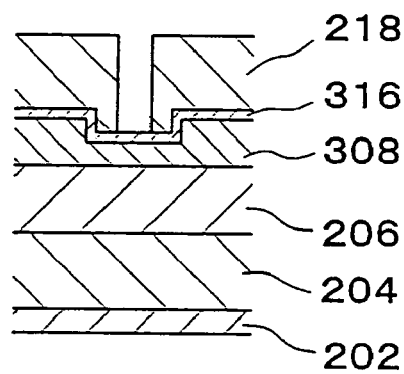

After the remaining photoresist (PR) layer 214 is removed through ashing, a second hard mask is formed over the trench pattern constituted of the first hard mask (second step) as shown in FIG. 4C. In this embodiment, the second hard mask is a thin film constituted of an SiON layer 316 (with a film thickness of less than 10 nm). Then, as shown in FIG. 4D, a photoresist (PR) layer 218 for via formation is formed over the second hard mask. Even if the SiLK™ layer 206 has become exposed during the first step due to over-etching of part of the first hard mask, the second hard mask constituted of the same material as the material constituting the first hard mask is formed over the first hard mask in the second step to cover the SiLK™ layer 206 having become exposed again. As a result, an advantage is achieved in that the SiLK and the resist are not allowed to become mixed with each other.

Figure 4E:
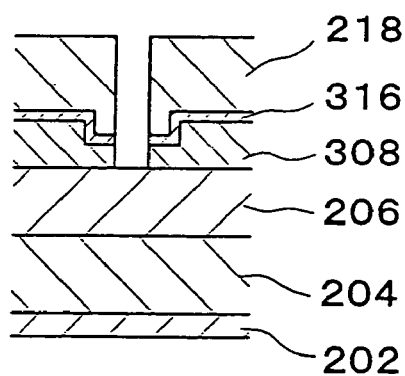

Next, as shown FIG. 4E, the SiON layer 316 constituting the second hard mask and the remaining SiON layer 308 constituting the first hard mask are etched through a specific lithographic process executed by using the photoresist (PR) layer 218 for via formation and thus, a via pattern is formed (third step).

Figure 4F:
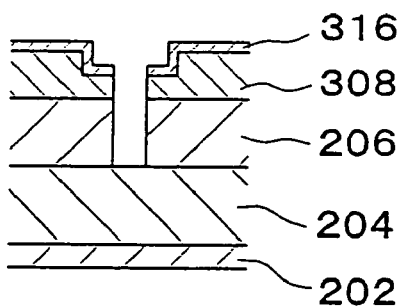

Then, by using the via hard mask constituted of the second hard mask and the first hard mask which have been formed through the third step, the SiLK™ layer 206 constituted of an organic low-k film is etched and vias are formed at the SiLK™ layer 206 and the photoresist (PR) layer 218 is removed through ashing, as shown in FIG. 4F (fourth step). This step is executed under etching conditions which include, for instance, the pressure of the atmosphere within the processing chamber set to 100 mT, the level of the power applied to the electrodes set to 1000 W and the flow rates of $N_2$ and $H_2$ constituting the mixed gas set to 100 sccm and 300 sccm respectively. After the photoresist (PR) layer 218 is removed during the step, shoulder sag may occur at the exposed second hard mask due to over-etching.

Figure 5A:
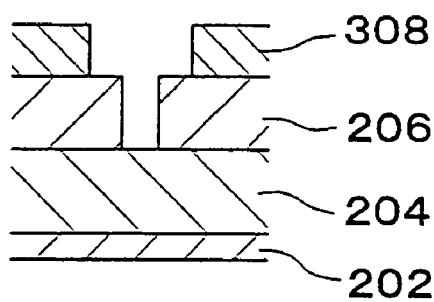
FIG. 5 shows steps executed in the etching method achieved in the embodiment.

Accordingly, the SiON layer 316 constituting the second hard mask where the shoulder sag has occurred is removed (fifth step), as shown in FIG. 5A. During this step, the SiON layer 316 constituting the second hard mask is removed and also, the via pattern portion of the SiON layer 308 constituting the first hard mask is etched to form a trench pattern.

Figure 5B:
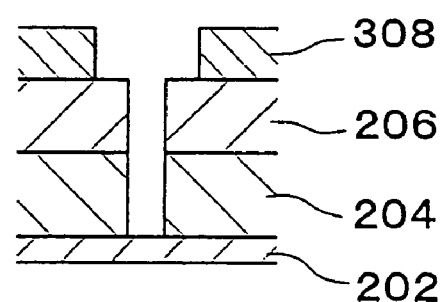

Next, as shown in FIG. 5B, vias are formed at the FSG layer 204 by using the vias formed at the SiLK™ layer 206 constituted of an organic low-k film as a via pattern (sixth step). The etching conditions include, for instance, the pressure of the atmosphere within the processing chamber set to 45 mT, the level of the power applied to the electrodes set to 1500 W and the flow rates of the $C_4F_8$, CO and Ar constituting the mixed gas set to 12 sccm, 225 sccm and 400 sccm respectively.

Figure 5C:
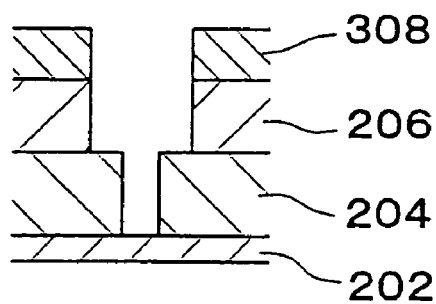

Then, as shown in FIG. 5C, a trench pattern is formed at the SiLK™ layer 206 by using the trench pattern at the SiON layer 308 constituting the first hard mask (seventh step).

Figure 5D:
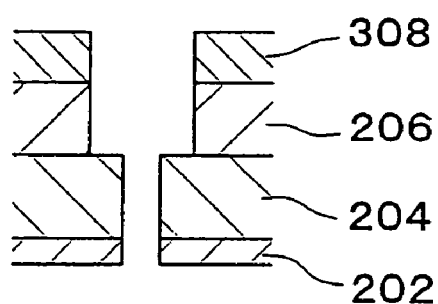
Figure 7A:
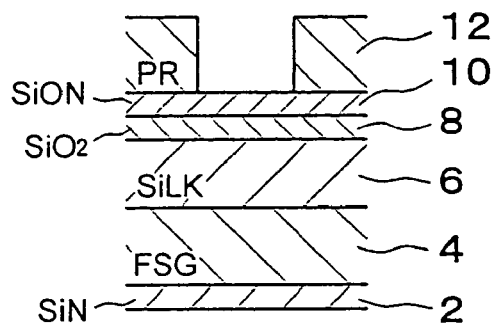
FIG. 7 shows steps executed in an etching method in the related art.
Figure 7B:
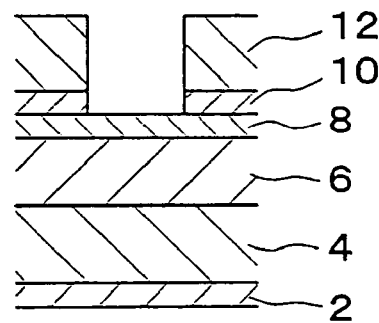
Figure 7C:
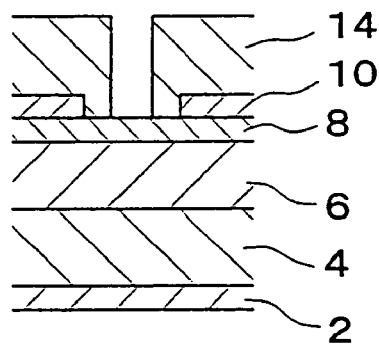
Figure 7D:
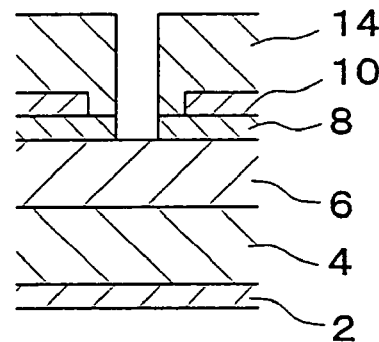
Figure 7E:
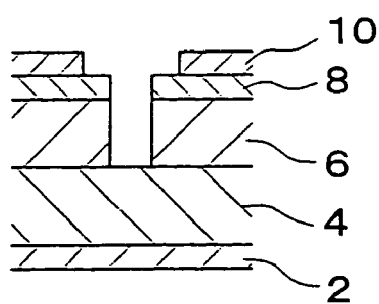
Figure 7F:
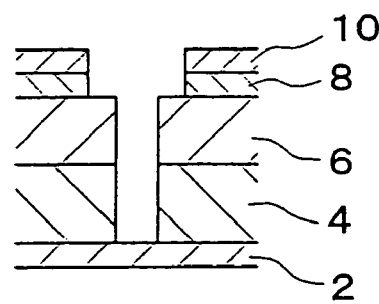
Figure 8A:
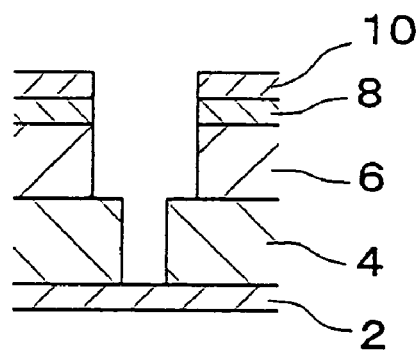
FIG. 8 shows steps executed in the etching method in the related art.
Figure 8B:
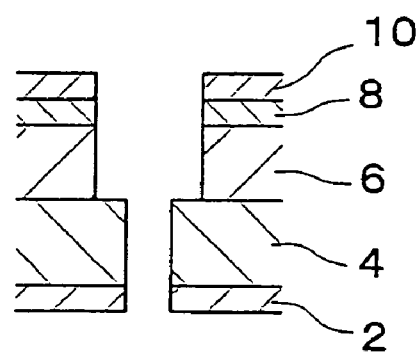
Figure 9:
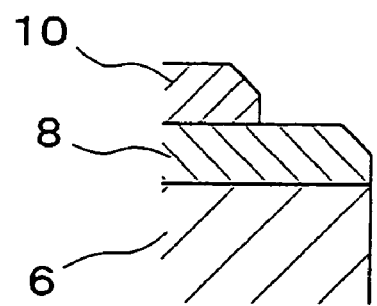
FIG. 9 is a partial enlargement showing shoulder sag occurring at a hard mask.

Next, as shown in FIG. 5D, the SiN layer 202 is etched by using the via pattern at the FSG layer 204 to achieve a through via hole. This process should be executed under etching conditions which include, for instance, the pressure of the atmosphere within the processing chamber set to 30 mT, the level of the power applied to the electrodes set to 500 W and the flow rates of $CH_2F_2$, $O_2$ and Ar constituting the mixed gas set to 20 sccm, 20 sccm and 100 sccm respectively. Through the steps described above, a dual damascene structure having trenches and vias formed simultaneously therein is completed. Then, a wiring step is completed by embedding Cu or a metal containing Cu (not shown) in the trenches and the vias.

As explained above, the second hard mask formed as a dummy film which is not allowed to remain in the finished dual damascene structure is placed over the trench pattern at the first hard mask in the embodiment. Thus, the second hard mask functions as a protective film for the first hard mask halfway through the process to minimize the extent of shoulder sag at the first hard mask. This advantage will prove even more effective under circumstances in which the adverse effect of shoulder sag is more significant in the related art, i.e., when the trench width is approximately 0.18 μm or smaller and the via diameter is approximately 0.13 μm or smaller. In addition, since the first hard mask and the second hard mask are constituted of the same material, an advantage is achieved in that the SiLK and the resist are not allowed to become mixed with each other even if the SiLK™ layer 206 becomes exposed due to over-etching of part of the first hard mask during the first step. Furthermore, since the SiON constituting the second hard mask also functions as a reflection-reducing film, there is an added advantage of sustaining dimensional stability during the lithography process.

It is to be noted that the following method may be adopted as a variation. In the fifth step, the SiON layer 316 constituting the second hard mask is not removed, and the SiON layer 316 is also left unetched during the etching process executed for the via formation at the FSG layer 204 in the sixth step. Then, through via holes are formed by etching the SiN layer 202. When the etching process is completed, the SiON layer 316 is removed through isotropic etching, and then the SiON layer 308 remaining at the trench portion is removed through a subsequent anisotropic etched-back process. In this case, the lowermost SiN layer 202 can be etched while the SiON layer 308 is still present at the trench portion and since SiON demonstrates a higher selection ratio than SiLK™ during the process of etching the SiN layer, an advantage is achieved in that the extent of shoulder sag at the top of the opening of the via hole, which occurs during the state corresponding to FIG. 5C through FIG. 5D in the method described earlier is minimized.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while an explanation is given above on examples in which the etching methods achieved in the embodiments are adopted in the plasma etching apparatus shown in FIG. 1, the present invention is not limited to these examples and it goes without saying that the present invention may be adopted in etching apparatuses that use various types of plasma sources as well as plane parallel type etching apparatuses.

In addition, while an explanation is given above in reference to the embodiments on an example in which SiLK™ is used to constitute the organic low-k film and FSG is used to constitute the inorganic low-k film, the present invention is not limited to this example. The organic low-k film may be a polynaphthalene fluoride polymer film, a maleimide benzocyclobutene polymer film, a polyperfluorocyclobutene aromatic ether film, a polyimide film, a polyallyl ether film, a Parylene film, a diamond hydride film or a polytetrafluoroethylene film. Moreover, the present invention may be adopted in conjunction with a divinyl siloxane benzocyclobutene polymer film having part of its organic macro-molecular film replaced with silica or a polyimide film containing silica. In addition, the inorganic low-k film may be constituted of an SiOC film (carbon-added silicon oxide film), an HSQ (hydrogen-added silicon oxide film) or the like.

Also, while the first hard mask constituted of $SiO_2$ and the second hard mask constituted of SiON are formed as mask layers over the organic low-k film in the first embodiment, the present invention is not limited to this example. Of the mask layers formed over the organic low-k film, i.e., the so-called hard masks, the first hard mask may be an insulating film such as a silicon nitride film (SiN), a silicon carbide film (SiC), a porous silicon nitride film, a silicon oxide nitride film (SiON), an aluminum nitride film (AlN) or a silica film as well as a silicon oxide film ($SiO_2$). Alternatively, it may be constituted of a metal nitride film such as titanium nitride (TiN) or tantalum nitride (TaN), or a titanium carbide film (TiC). However, when a conductive nitride film such as a TiN film or a TaN film is used, it is necessary to remove the conductive nitride film by polishing it off through chemical machining or through dry-etching after copper is embedded in the wiring grooves and the vias. In addition, the second hard mask may be constituted by using an insulating film such as a silicon oxide film ($SiO_2$), a silicon nitride film (SiN), a porous silica film or a silicon carbide film as well as SiON. It may instead be constituted with a metal nitride film such as titanium nitride (TiN) or tantalum nitride (TaN), or it may be formed of titanium carbide (TiC). The crucial point that should be kept in mind when selecting materials to constitute the hard masks is that different materials should be selected to constitute the first hard mask and the second hard mask.

Moreover, while through via holes are formed at the SiN layer 202 after the trench pattern is formed at the SiLK™ layer 206 in the seventh step in the two embodiments described above, the present invention is not limited to this example. The trench pattern may be formed at the SiLK™ layer 206 after through via holes are formed at the SiN layer 202, instead. In addition, the etching conditions and the film thicknesses are not limited to the specific examples used in the embodiments, either.

As described above, in the etching method according to the present invention, a thin hard mask film (dummy film) is placed over the hard mask for trench formation in the related art for purposes of protection, and the protective dummy film is later removed, when forming a dual damascene structure. As a result, an advantage is achieved in that the extent of shoulder sag at the hard mask for trench formation, which becomes exposed during the processing in the related art is lessened. Thus, the shoulder of the hard mask achieves substantial verticality, a shape that is ideal, which enables the formation of a desired wiring structure.

What is claimed is:

1. An etching method for achieving a dual damascene structure by using at least one layer of a low-k film and at least one layer of a hard mask, wherein:
   said at least one layer of said hard mask is patterned;
   a two-layer dummy film, the entirety of which will ultimately be removed from said dual damascene structure, including a first layer formed over and in contact with said patterned hard mask and a second layer entirely formed over and in contact with said first layer in order to prevent shoulder sag; and
   said patterned hard mask and said dummy film include films constituted of a same material.

2. The etching method for achieving said dual damascene structure according to claim 1, wherein:
   said low-k film is constituted with two different types of films that are etched by using different gases.

3. The etching method for achieving said dual damascene structure according to claim 2, wherein:
   a lower film constituting said low-k film is an inorganic low-k film and an upper film constituting said low-k film is an organic low-k film.

4. The etching method for achieving said dual damascene structure according to claim 1, wherein:
   said hard mask has a one-layer structure.

5. The etching method for achieving said dual damascene structure according to claim 4, wherein:
   said hard mask is constituted of a silicon oxide nitride film.

6. The etching method for achieving said dual damascene structure according to claim 5, wherein:
   said dummy film is a silicon oxide nitride film.

7. The etching method for achieving said dual damascene structure according to claim 1, wherein:
   said hard mask has a two-layer structure.

8. The etching method for achieving said dual damascene structure according to claim 7, wherein:
   at least one layer in said hard mask is a silicon oxide nitride film.

9. The etching method for achieving said dual damascene structure according to claim 8, wherein:
   said dummy film is a silicon oxide nitride film.

10. An etching method for achieving a dual damascene structure having vias formed at an inorganic low-k film layer and trenches formed at an organic low-k film layer by etching said inorganic low-k film, the organic low-k film, a first hard mask and a second hard mask sequentially laminated on a lower wiring layer, comprising:
    a first step in which a trench pattern is formed at said second hard mask through a lithography process;
    a second step in which a third hard mask is formed over the trench pattern constituted of said second hard mask;
    a third step in which a via pattern is formed at said third hard mask and said first hard mask through a lithography process;
    a fourth step in which vias are formed at the organic low-k film by using the via pattern constituted of said third hard mask and said first hard mask;
    a fifth step in which said third hard mask is at least partially removed;
    a sixth step in which the remaining third hard mask layer is removed, a trench pattern is formed at said first hard mask by using the trench pattern constituted of said second hard mask and vias are formed at said inorganic low-k film by using the vias formed at the organic low-k film as a via pattern without altering etching conditions; and
    a seventh step in which trenches are formed at the organic low-k film by using the trench pattern constituted of said first hard mask and said second hard mask.

11. The etching method for achieving said dual damascene structure according to claim 10, wherein:
    said third mask is a dummy film that will ultimately be removed from said dual damascene structure.

12. The etching method for achieving said dual damascene structure according to claim 11, wherein:
    said third hard mask has a multilayer structure.

13. The etching method for achieving said dual damascene structure according to claim 12, wherein:
    an upper layer of said third mask is removed in said fifth step and a lower layer of said third hard mask is removed in said sixth step.

14. The etching method for achieving said dual damascene structure according to claim 13, wherein:
    said upper layer of said third hard mask is constituted of a silicon oxide nitride film and said lower layer of said third hard mask is constituted of a silicon oxide film.

15. An etching method for achieving a dual damascene structure having vias formed at an inorganic low-k film layer and trenches formed at an organic low-k film layer by etching said inorganic low-k film, the organic low-k film, a first hard mask and a second hard mask sequentially laminated on a lower wiring layer, comprising:
    a first step in which a trench pattern is formed at said second hard mask through a lithography process;
    a second step in which a third hard mask is formed over the trench pattern constituted of said second hard mask;

a third step in which a via pattern is formed at said third hard mask and said first hard mask through a lithography process;

a fourth step in which vias are formed at the organic low-k film by using the via pattern constituted of said third hard mask and said first hard mask;

a fifth step in which said third hard mask is removed, a trench pattern is formed at said first hard mask by using the trench pattern constituted of said second hard mask and vias are formed at said inorganic low-k film by using the vias formed at the organic low-k film as a via pattern without altering etching conditions; and a sixth step in which trenches are formed at the organic low-k film by using the trench pattern constituted of said first hard mask and said second hard mask.

16. The etching method for achieving said dual damascene structure according to claim 15, wherein:

said third hard mask is a dummy film that will ultimately be removed from said dual damascene structure.

17. The etching method for achieving said dual damascene structure according to claim 16, wherein:

said third hard mask has a multilayer structure.

18. An etching method for achieving a dual damascene structure having vias formed at an inorganic low-k film layer and trenches formed at an organic low-k film layer by etching said inorganic low-k film, the organic low-k film and a first hard mask sequentially laminated on a lower wiring layer, comprising:

a first step in which a trench pattern is formed at part of said first hard mask through a lithography process;

a second step in which a second hard mask is formed over the trench pattern at said first hard mask;

a third step in which a via pattern is formed at the remaining first hard mask and said second hard mask through a lithography process;

a fourth step in which vias are formed at the organic low-k film by using the via pattern constituted of said first hard mask and said second hard mask;

a fifth step in which a trench pattern is formed by removing said second hard mask and etching the trench pattern portion of said first hard mask;

a sixth step in which vias are formed at said inorganic low-k film by using the vias formed at the organic low-k film as a via pattern; and a seventh step in which trenches are formed at the organic low-k film by using the trench pattern constituted of said first hard mask.

19. The etching method for achieving said dual damascene structure according to claim 18, wherein:

said second hard mask is a dummy film that will ultimately be removed from said dual damascene structure.

20. The etching method for achieving said dual damascene structure according to claim 19, wherein:

said first hard mask and said second hard mask are constituted of a same material.

21. The etching method for achieving said dual damascene structure according to claim 20, wherein:

said material is a silicon oxide nitride film.

22. An etching method for achieving a dual damascene structure having vias formed at an inorganic low-k film layer and trenches formed at an organic low-k film layer by etching said inorganic low-k film, the organic low-k film and a first hard mask sequentially laminated on a lower wiring layer, comprising:

a first step in which a trench pattern is formed at part of said first hard mask through a lithography process;

a second step in which a second hard mask is formed over the trench pattern at said first hard mask;

a third step in which a via pattern is formed at the remaining first hard mask and said second hard mask through a lithography process;

a fourth step in which vias are formed at the organic low-k film by using the via pattern constituted of said first hard mask and said second hard mask;

a fifth step in which vias are formed at the inorganic low-k film by using the vias formed at the organic low-k film as a via pattern;

a sixth step in which said second hard mask is removed;

a seventh step in which a trench pattern is formed by etching the trench pattern portion of said first hard mask; and an eighth step in which trenches are formed at the organic low-k film by using the trench pattern constituted of said first hard mask.

23. The etching method for achieving said dual damascene structure according to claim 22, wherein:

said second hard mask is a dummy film that will ultimately be removed from said dual damascene structure.

24. The etching method for achieving said dual damascene structure according to claim 23, wherein:

said first hard mask and said second hard mask are constituted of a same material.

25. The etching method for achieving said dual damascene structure according to claim 24, wherein:

said material is a silicon oxide nitride film.

* * * * *